(12) United States Patent
Lin

(10) Patent No.: US 11,304,331 B1
(45) Date of Patent: Apr. 12, 2022

(54) HEAT DISSIPATING MODULE HAVING AUXILIARY FAN

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 0 days.

(21) Appl. No.: 17/060,064

(22) Filed: Sep. 30, 2020

(51) Int. Cl.
*H05K 7/20* (2006.01)
*G06F 1/20* (2006.01)

(52) U.S. Cl.
CPC ..... *H05K 7/20154* (2013.01); *H05K 7/20172* (2013.01); *H05K 7/20409* (2013.01); *G06F 1/20* (2013.01); *H05K 7/2029* (2013.01); *H05K 7/20145* (2013.01)

(58) Field of Classification Search
CPC .......... H05K 7/20145–20163; H05K 7/20172; H05K 7/20336; H05K 7/20409; G06F 1/20; G06F 1/203
See application file for complete search history.

(56) References Cited

U.S. PATENT DOCUMENTS

| | | | | |
|---|---|---|---|---|
| 6,795,315 B1 * | 9/2004 | Wu | ........................... | G06F 1/20 165/104.33 |
| 7,277,280 B2 * | 10/2007 | Peng | ........................ | G06F 1/20 257/E23.099 |
| 7,782,617 B2 * | 8/2010 | Li | ............................. | G06F 1/20 361/700 |
| 9,036,348 B2 * | 5/2015 | Huang | ..................... | G06F 1/20 361/695 |
| 2015/0070837 A1 * | 3/2015 | Hsu | .......................... | G06F 1/20 361/679.47 |

FOREIGN PATENT DOCUMENTS

| CN | 102137581 B | * | 5/2015 | |
|---|---|---|---|---|
| DE | 202012101073 U1 | * | 5/2012 | ............. G06F 1/183 |
| EP | 2426575 A2 | * | 3/2012 | ............... G06F 1/20 |

* cited by examiner

*Primary Examiner* — Zachary Pape
(74) *Attorney, Agent, or Firm* — Chun-Ming Shih; HDLS IPR Services

(57) ABSTRACT

A heat dissipating module includes a heat dissipating assembly, a centrifugal fan, an airflow guiding hood and an auxiliary fan. The heat dissipating assembly includes a heat dissipating board and fins disposed thereon. Heat dissipating channels are formed between the fins. The centrifugal fan is disposed at a side of the heat dissipating channels. The airflow guiding hood covers the heat dissipating assembly and the centrifugal fan and is provided with a first airflow opening over the centrifugal fan, a second airflow opening over the fins and a third airflow opening at another side of the heat dissipating channels. The auxiliary fan is disposed between the fins and the second airflow opening.

6 Claims, 6 Drawing Sheets

HEAT DISSIPATING MODULE HAVING AUXILIARY FAN

BACKGROUND OF THE INVENTION

Technical Field

The invention relates to a heat dissipating structure installed onto a display card, a sound card and a network card, and particularly to a heat dissipating module.

Related Art

Currently, 3C products are installed with add-on cards such a display card, a sound card and a network card to enhance additional functions. With the improvement of performance of those add-on cards, however, temperature in 3C products may be over high to damage electronic components therein.

To reduce interior temperature of 3C products, a general solution is to adopt air cooling to cool down the add-on cards. That is, a cooler is attached on an add-on card and a fan is installed on a side of the cooler to dissipate heat from the cooler by convection. Under this existing arrangement, how to further improve its effect of heat dissipation is an uninterrupted target of the heat dissipation technology.

In view of this, the inventors have devoted themselves to the above-mentioned prior art, researched intensively and cooperated with the application of science to try to solve the above-mentioned problems. Finally, the invention which is reasonable and effective to overcome the above drawbacks is provided.

SUMMARY OF THE INVENTION

The invention provides a heat dissipating module which utilizes an auxiliary fan above fins to increase efficiency of heat dissipation of a heat dissipating module.

In embodiments of the invention, the invention provides a heat dissipating module which includes a heat dissipating assembly, a centrifugal fan, an airflow guiding hood and an auxiliary fan. The heat dissipating assembly includes a heat dissipating board and fins disposed thereon. Heat dissipating channels are formed between the fins. The centrifugal fan is disposed at a side of the heat dissipating channels. The airflow guiding hood covers the heat dissipating assembly and the centrifugal fan and is provided with a first airflow opening over the centrifugal fan, a second airflow opening over the fins and a third airflow opening at another side of the heat dissipating channels. The auxiliary fan is disposed between the fins and the second airflow opening.

Accordingly, the auxiliary fan is disposed between the fins and the second airflow opening to increase efficiency of heat dissipation of a heat dissipating module.

DETAILED DESCRIPTION OF THE INVENTION

To further disclose the features and technical contents of the invention, please refer to the following description and the drawings. However, the drawings are used for reference and description only, not for limitation to the invention.

Figure 1:
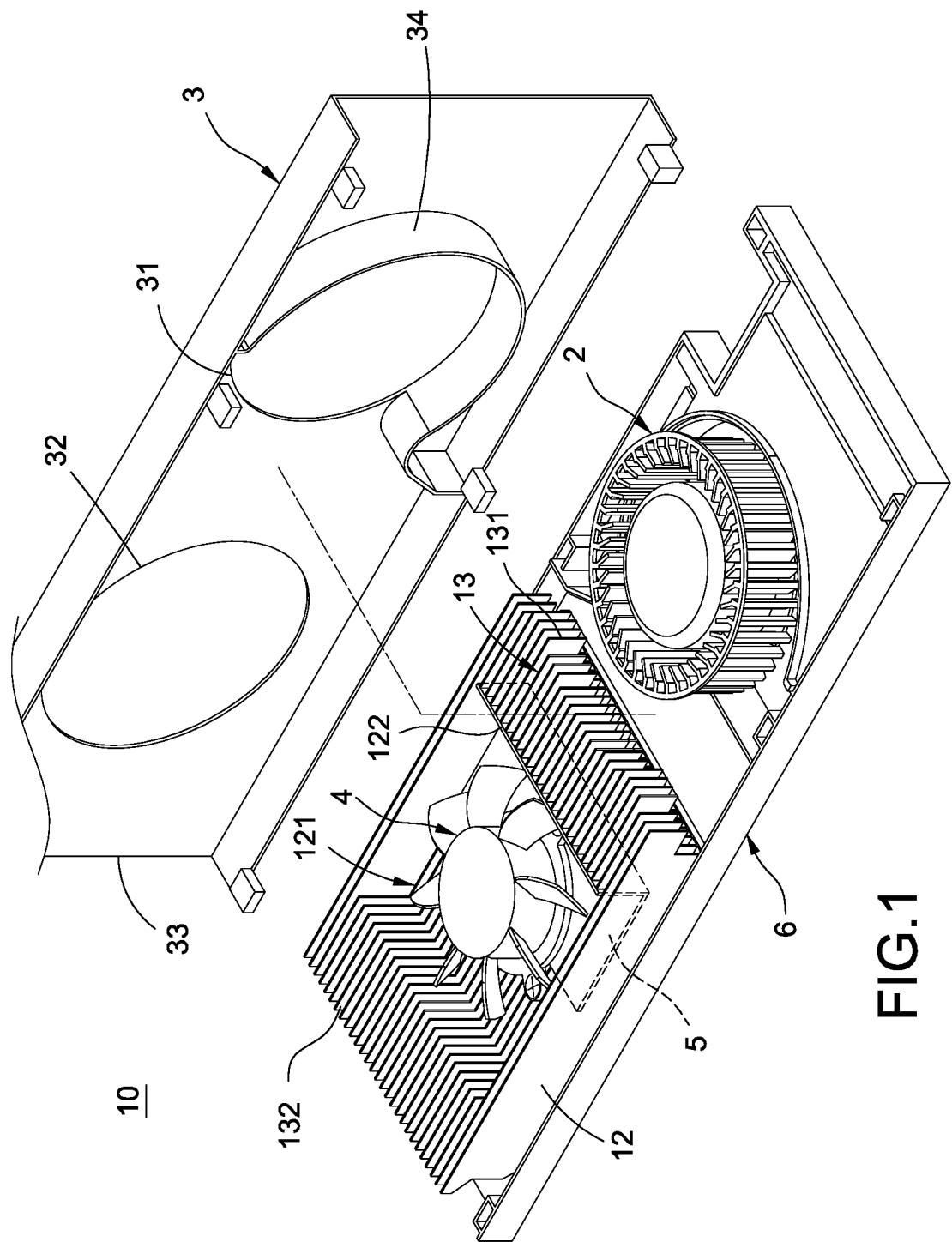
FIG. 1 is an exploded view of the first embodiment of the heat dissipating module of the invention.
Figure 2:
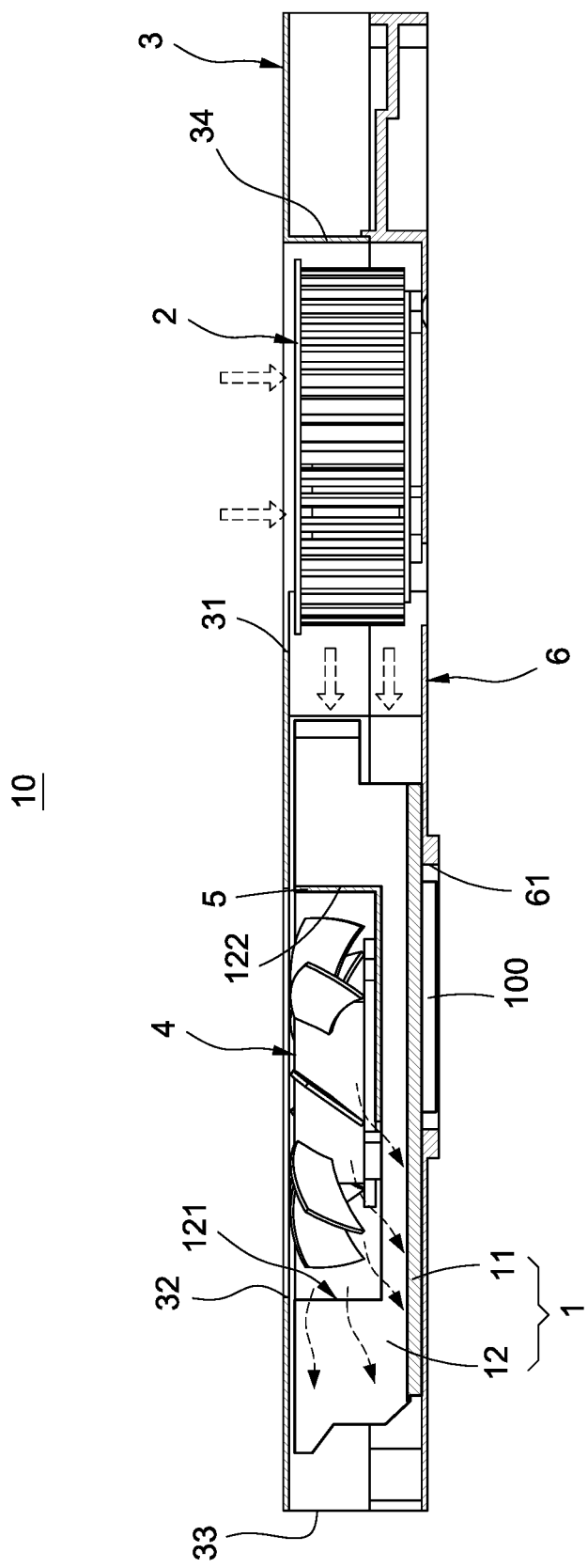
FIG. 2 is a cross-sectional view of the first embodiment of the heat dissipating module of the invention.

Please refer to FIGS. 1 and 2. The invention provides a first embodiment of a heat dissipating module 10 which includes a heat dissipating assembly 1, a centrifugal fan 2, an airflow guiding hood 3 and an auxiliary fan 4.

As shown in FIGS. 1 and 2, the heat dissipating assembly 1 includes a heat dissipating board 11 and fins 12 disposed on the heat dissipating board 11. The fins 12 are parallelly arranged at intervals to form heat dissipating channels 13 between the fins 12. The heat dissipating board 11 is a thermos-conductive block or a vapor chamber.

Also, the fins 12 are formed with a recess portion 121 downward from the top. The inside of the recess portion 121 has an L-shaped inner wall 122 adjacent to the centrifugal fan 2.

As shown in FIGS. 1 and 2, the centrifugal fan 2 is disposed at a side of the heat dissipating channels 13. The airflow guiding hood 3 covers both the heat dissipating assembly 1 and the centrifugal fan 2. The airflow hood 3 is provided with a first airflow opening 31 over the centrifugal fan 2, a second airflow opening 32 over the fins 12 and a third airflow opening 33 at the other side of the heat dissipating channels 13.

As shown in FIG. 1, two ends of each heat dissipating channel 13 have a first passing opening 131 and a second passing opening 132. Each first passing opening 131 is arranged correspondingly to the centrifugal fan 2. Each second passing opening 132 is arranged correspondingly to the third airflow opening 33.

As shown in FIGS. 1 and 2, the auxiliary fan 4 is disposed between the fins 12 and the second airflow opening 32 and received in the recess portion 121. In this embodiment, the auxiliary fan 4 is a down-blowing axial fan, but not limited to this.

As shown in FIGS. 1 and 2, the heat dissipating module 10 of the invention further includes a partition 5 disposed between the auxiliary fan 4 and the fins 12 and attached on the L-shaped inner wall 122.

As shown in FIGS. 1 and 2, the heat dissipating module 10 of the invention further includes a bottom plate 6 on which the heat dissipating board 11 and the centrifugal fan 2 are mounted. The bottom plate 6 is formed with an aperture 61 exposing the heat dissipating board 11. A heating element 100 such as a display card, a sound card or a network card is thermally attached on the heat dissipating board 11 through the aperture 61.

In addition, the airflow guiding hood 3 covers and is fixed to the bottom plate 6. The airflow guiding hood 3 is extended with an airflow blocking plate 34 abutting against the bottom plate 6 and disposed at a side of the centrifugal fan 2, which is located apart from the heat dissipating assembly 1.

As shown in FIG. 2, the heat dissipating module 10 of the invention uses the heating element 100 thermally attached on the heat dissipating board 11, so heat of the heating element 100 is conducted to the fins 12 via the heat dissipating board 11. After that, the centrifugal fan 2 will generate a first airflow from the first airflow opening 31 toward the third airflow opening 33. Heat can be blown out of the third airflow opening 33 by the first airflow passing the fins 12 to accomplish the function of promoting heat dissipation of the heating element 100.

In addition, the auxiliary fan 4 is disposed between the fins 12 and the second airflow opening 32. Because the auxiliary fan 4 in this embodiment is a down-blowing axial fan, the sown-blowing axial fan will generate a second airflow from the second airflow opening 32 toward the fins 12. The second airflow is guided by the first airflow to jointly accelerate to blow heat out of the third airflow opening 33 to enhance efficiency of heat dissipation of the heat dissipating module 10.

Also, the fins 12 are formed with a recess portion 121 downward from the top. The auxiliary fan 4 is embedded inside the fins 12 so as to make the heat dissipating module 10 keep its original thickness to keep light and thin in volume of the heat dissipating module 10.

Further, the heat dissipating module 10 of the invention further includes a partition 5, the inside of the recess portion 121 has an L-shaped inner wall 122 adjacent to the centrifugal fan 2, and the partition 5 is disposed between the auxiliary fan 4 and the fins 12 and attached on the L-shaped inner wall 122, so the partition 5 at the L-shaped inner wall 122 can block the second airflow and isolate the first airflow to avoid the second airflow from blowing toward the centrifugal fan 2 and stably guide the first airflow to pass the heat dissipating channels 13 to enhance efficiency of heat dissipation of the heat dissipating module 10.

Figure 3:
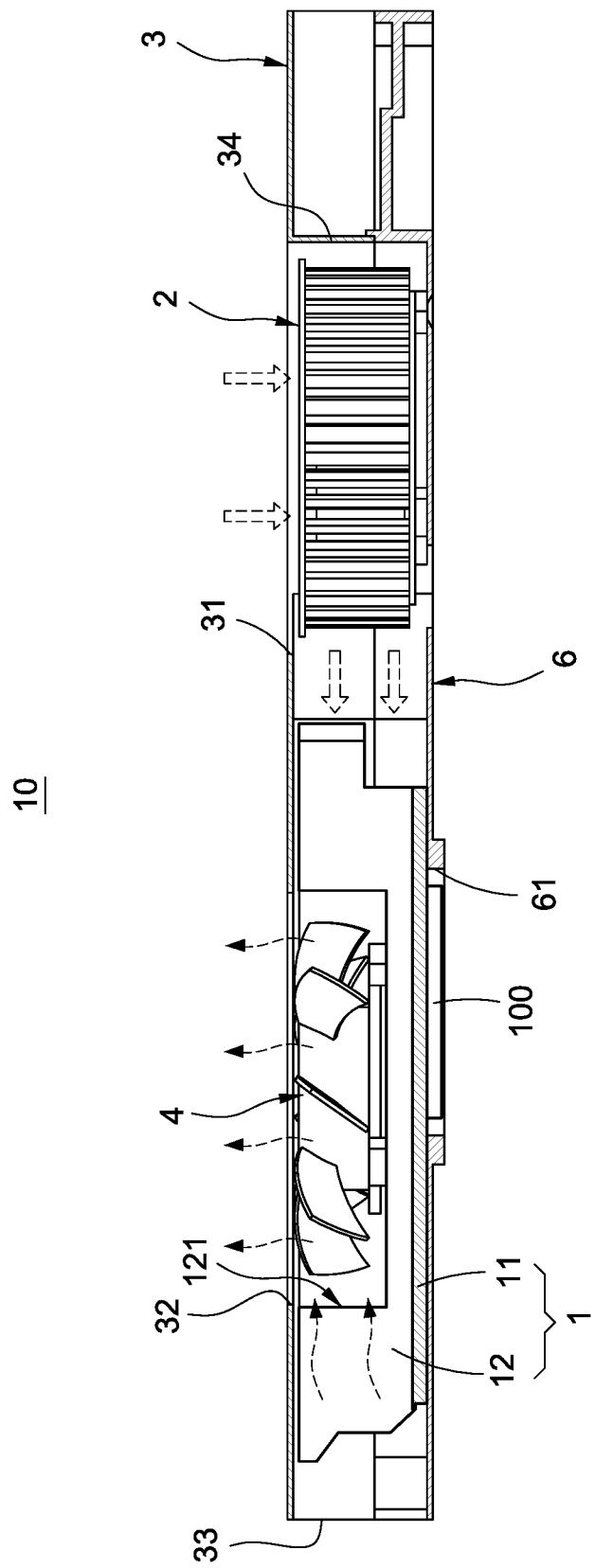
FIG. 3 is a cross-sectional view of the second embodiment of the heat dissipating module of the invention.

Please refer to FIG. 3 which shows the second embodiment of the heat dissipating module of the invention. The second embodiment is substantially identical to the first embodiment. The second embodiment differs from the first embodiment by the auxiliary fan 4 of this embodiment being an up-blowing axial fan.

In detail, the auxiliary fan 4 is an up-blowing axial fan, so the up-blowing axial fan generates a second airflow from the third airflow opening 33 toward the second airflow opening 32 via the fins 12, and the first airflow is guided by the second airflow to jointly accelerate to blow heat out of the second airflow opening 32 to enhance efficiency of heat dissipation of the heat dissipating module 10.

Also, the second airflow of this embodiment does not conflict with the first airflow in direction, so the second embodiment can omit the partition 5 of the first embodiment as shown in FIG. 2.

Figure 4:
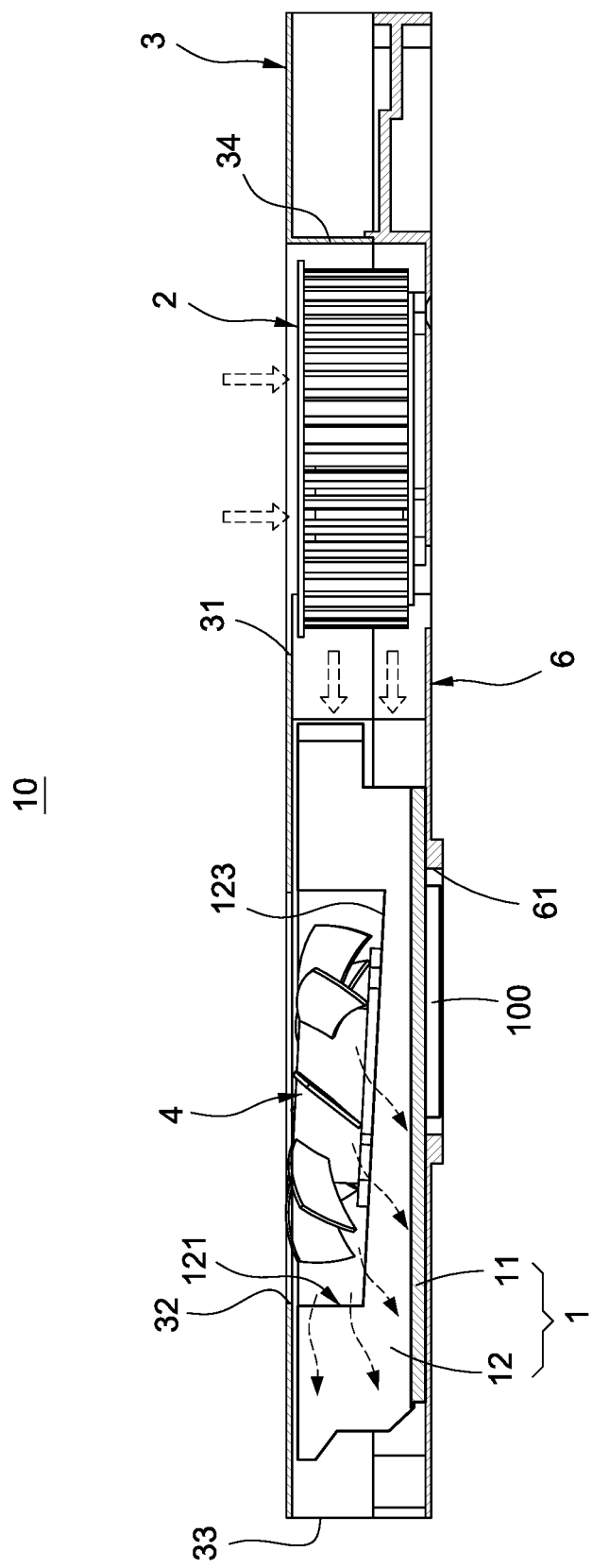
FIG. 4 is a cross-sectional view of the third embodiment of the heat dissipating module of the invention.

Please refer to FIG. 4 which shows the third embodiment of the heat dissipating module of the invention. The third embodiment is substantially identical to the first embodiment. The third embodiment differs from the first embodiment by the recess portion 121 of this embodiment having a slant bottom 123.

In detail, the recess portion 121 has a slant bottom 123 which gradually increases height from the first passing openings 131 to the second passing openings 132. When the auxiliary fan 4 is fixed on the slant bottom 123, the auxiliary fan 4 is aslant arranged relative to the heat dissipating board 11 in a manner gradually increasing height from the first passing openings 131 to the second passing openings 132.

The auxiliary fan 4 of the embodiment is an down-blowing axial fan, so the down-blowing axial fan generates a second airflow aslant toward the third airflow opening 33, and the second airflow is guided by the first airflow to jointly accelerate to blow heat out of the third airflow opening 33 to enhance efficiency of heat dissipation of the heat dissipating module 10.

Also, the second airflow of this embodiment does not conflict with the first airflow in direction, so the third embodiment can omit the partition 5 of the first embodiment as shown in FIG. 2.

Figure 5:
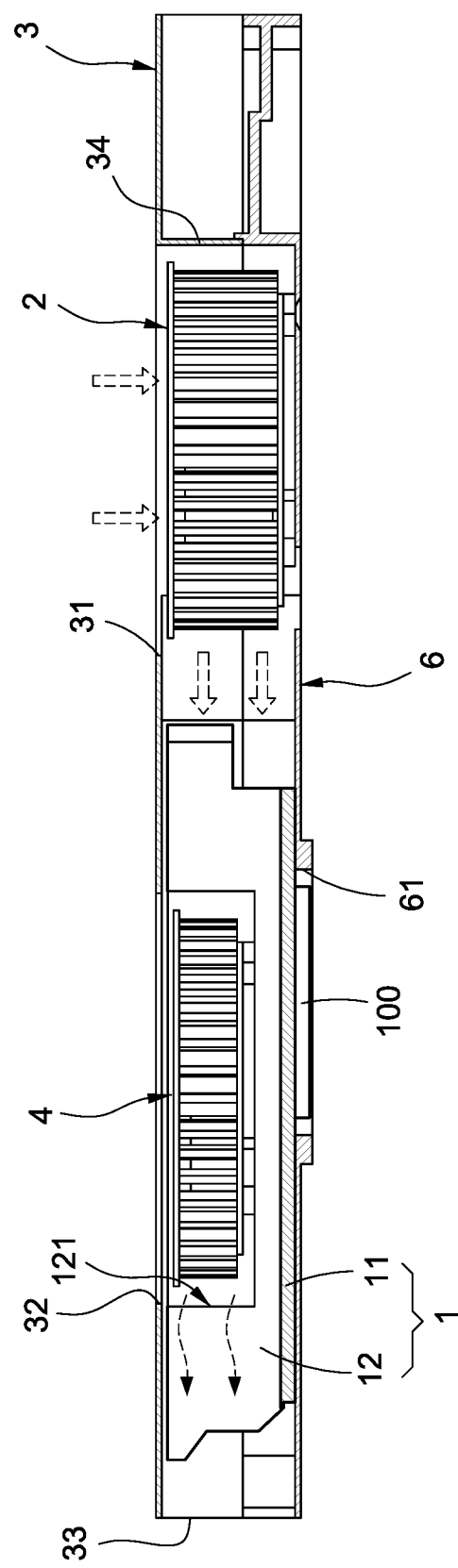
FIG. 5 is a cross-sectional view of the fourth embodiment of the heat dissipating module of the invention.

Please refer to FIG. 5 which shows the fourth embodiment of the heat dissipating module of the invention. The fourth embodiment is substantially identical to the first embodiment. The fourth embodiment differs from the first embodiment by the auxiliary fan 4 of this embodiment being a centrifugal fan.

In detail, the auxiliary fan 4 is a centrifugal fan, so the centrifugal fan generates a second airflow from the second airflow opening 32 toward the third airflow opening 33 via the fins 12, and the first airflow is guided by the second airflow to jointly accelerate to blow heat out of the second airflow opening 32 to enhance efficiency of heat dissipation of the heat dissipating module 10.

Also, the second airflow of this embodiment does not conflict with the first airflow in direction, so the fourth embodiment can omit the partition 5 of the first embodiment as shown in FIG. 2.

Figure 6:
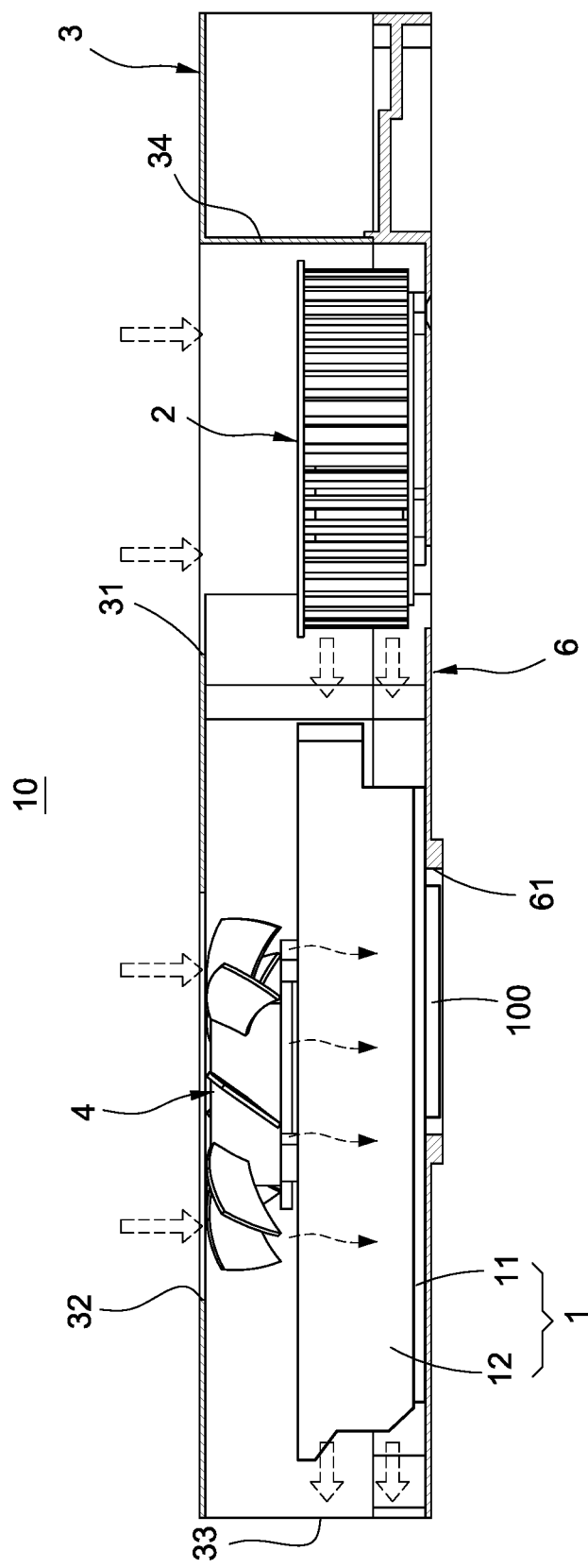
FIG. 6 is a cross-sectional view of the fifth embodiment of the heat dissipating module of the invention.

Please refer to FIG. 6 which shows the fifth embodiment of the heat dissipating module of the invention. The fifth embodiment is substantially identical to the first embodiment. The fifth embodiment differs from the first embodiment by the fins 12 of this embodiment without the recess portion 121 as shown in FIG. 2. The auxiliary 4 is directly mounted between the top of the fins 12 and the second airflow opening 32. Although this causes height increase of the heat dissipating module 10, efficiency of heat dissipation of the heat dissipating module 10 can be still enhanced.

It will be appreciated by persons skilled in the art that the above embodiments have been described by way of example only and not in any limitative sense, and that various alterations and modifications are possible without departure from the scope of the invention as defined by the appended claims.

What is claimed is:

1. A heat dissipating module comprising:
    a heat dissipating assembly, comprising a heat dissipating board and fins disposed thereon, and heat dissipating channels being formed between the fins, wherein the fins are formed with a recess portion downward from a top thereof;
    a centrifugal fan disposed at a side of the heat dissipating channels, wherein an inside of the recess portion has an L-shaped inner wall adjacent to the centrifugal fan;
    an airflow guiding hood, covering the heat dissipating assembly and the centrifugal fan, and provided with a first airflow opening over the centrifugal fan, a second airflow opening over the fins and a third airflow opening at another side of the heat dissipating channels;
    an auxiliary fan disposed between the fins and the second airflow opening, wherein the auxiliary fan is received in the recess portion, and the auxiliary fan is a down-blowing axial fan; and
    a partition disposed between the auxiliary fan and the fins and attached on the L-shaped inner wall.

2. The heat dissipating module of claim 1, wherein two ends of each heat dissipating channel have a first passing opening and a second passing opening, each first passing opening is arranged correspondingly to the centrifugal fan, and each second passing opening is arranged correspondingly to the third airflow opening.

3. The heat dissipating module of claim 2, wherein the auxiliary fan is aslant arranged relative to the heat dissipating board in a manner gradually increasing height from the first passing openings to the second passing openings.

4. The heat dissipating module of claim 3, wherein the recess portion has a slant bottom which gradually increases height from the first passing openings to the second passing openings, and the auxiliary fan is fixed on the slant bottom.

5. The heat dissipating module of claim 1, wherein the heat dissipating board is a thermos-conductive block or a vapor chamber.

6. The heat dissipating module of claim 1, further comprising a bottom plate, wherein the heat dissipating board and the centrifugal fan are mounted on the bottom plate, the bottom plate is formed with an aperture exposing the heat dissipating board, the airflow guiding hood covers and is fixed to the bottom plate, and the airflow guiding hood is extended with an airflow blocking plate abutting against the bottom plate and disposed at a side of the centrifugal fan, which is located apart from the heat dissipating assembly.

\* \* \* \* \*